US008539320B2

(12) United States Patent
Poulain

(10) Patent No.: US 8,539,320 B2
(45) Date of Patent: Sep. 17, 2013

(54) DEVICE AND METHOD FOR THE FINE SYNCHRONISATION OF DIFFERENT VERSIONS OF A RECEIVED DATA STREAM

(75) Inventor: Ludovic Poulain, Le Germanium (FR)

(73) Assignee: Enensys Technologies, Rennes (FR)

( * ) Notice: Subject to any disclaimer, the term of this patent is extended or adjusted under 35 U.S.C. 154(b) by 200 days.

(21) Appl. No.: 13/121,861

(22) PCT Filed: Oct. 6, 2009

(86) PCT No.: PCT/EP2009/062969
§ 371 (c)(1),
(2), (4) Date: Mar. 30, 2011

(87) PCT Pub. No.: WO2010/040743
PCT Pub. Date: Apr. 15, 2010

(65) Prior Publication Data
US 2011/0179340 A1 Jul. 21, 2011

(30) Foreign Application Priority Data
Oct. 6, 2008 (FR) .................................... 08 56737

(51) Int. Cl.
*H03M 13/00* (2006.01)

(52) U.S. Cl.
USPC ........... 714/776; 714/747; 714/763; 370/404; 370/503

(58) Field of Classification Search
USPC ........................................ 714/747, 763, 776
See application file for complete search history.

(56) References Cited

U.S. PATENT DOCUMENTS

2003/0118042 A1 6/2003 Nishida et al.
2007/0237185 A1 * 10/2007 Pereira et al. ................ 370/503

FOREIGN PATENT DOCUMENTS

WO 03/084118 10/2003

OTHER PUBLICATIONS

International Search Report for PCT/EP2009/062969 mailed Nov. 6, 2009.
Written Opinion for PCT/EP2009/062969 mailed Nov. 6, 2009.
Preliminary Examination Report on Patentability in English, for PCT/EP2009/062969; mailed Jun. 9, 2011.

* cited by examiner

*Primary Examiner* — Sam Rizk
(74) *Attorney, Agent, or Firm* — Nixon & Vanderhye PC

(57) ABSTRACT

The Invention pertains to the field of broadcasting digital services to terminals for transmitting said services, and concerns the problem of the smooth transfer between two versions of a same stream upstream from a transmitter within transmission networks on a single modulation frequency. The invention relates to a device for the fine synchronization of different versions of a data stream received with a certain offset or various jitters. In order to do so, the device includes different paths for detecting errors (ETR) and synchronizing the stream (SNF).

9 Claims, 2 Drawing Sheets

DEVICE AND METHOD FOR THE FINE SYNCHRONISATION OF DIFFERENT VERSIONS OF A RECEIVED DATA STREAM

This application is the U.S. national phase of International Application No. PCT/EP2009/062969, filed 6 Oct. 2009, which designated the U.S. and claims priority to French application Ser. No. 08/56737, filed 6 Oct. 2008, the entire contents of each of which are hereby incorporated by reference.

The present invention concerns the field of the broadcasting of digital services to terminals for transmitting such services. More particularly, it concerns the problem of switching without impact between two versions of the same stream upstream of a transmitter in the context of transmission networks on a single modulation frequency.

Networks for broadcasting digital services on a single modulation frequency or SFN (standing for Single Frequency Networks) are widespread in a certain number of broadcasting systems. There can be cited for example the DVB-T (Digital Video Broadcasting-Terrestrial) broadcasting standards: "ETSI EN 300 744 V1.5.1, Digital Video Broadcasting (DVB)"; DVB-H (Digital Video Broadcasting-Handheld): "ETSI EN 302 304, DVB-H—Transmission System for Handheld Terminals"; or the Chinese standard DTMB (Digital Terrestrial Multimedia Broadcast) previously called DMB-T/H (Digital Multimedia Broadcast-Terrestrial/Handheld), which use such SFN broadcasting networks.

SFN networks are characterised in that the broadcasting of the services is effected by the transmission of the same data stream by different transmitters on a single modulation frequency. Because of this it is necessary for these different transmitters to be finely synchronised with each other in order to avoid generating interference in the places situated at the junction of the coverage areas of the different transmitters.

Such synchronisation between the different SFN transmitters may for example be achieved by the insertion in the stream distributed to these transmitters of synchronisation packets such as MIP packets (Mega-frame Initialisation Packets) used in the DVB-H and DVB-T standards. This mechanism is described in the document: "Digital Video Broadcasting (DVB); DVB mega-frame for Single Frequency Network (SFN) synchronization" of the ETSI (European Telecommunications Standards Institute) under the reference ETSI TS 101 191V1.4.1 (2004-06). The transmission point receiving the stream is then synchronised on the received stream, for example by means of these MIP packets. This synchronisation of the transmission point on the received stream, giving rise to synchronisation of all the transmission points with each other, is called the SFN synchronisation of the transmission point.

For the purpose of making the distribution of the stream reliable, it is usual to repeat this distribution between the central stream generation point and the different transmitters. This redundancy can be achieved within the same distribution network or using several different networks. An illustration of an example of this architecture of the broadcasting system is given in FIG. 1. The broadcasting system of FIG. 1 comprises a first central point 1.1 serving as a distribution point for the data stream comprising the services to be broadcast. This stream is then routed by one or more distribution networks, 1.2 and 1.3 in the figure, to a plurality of transmitters 1.4 and 1.5 responsible for broadcasting to the end users. It should be noted that, in the context of this document, distribution means the operation consisting of routing the stream between the central point 1.1 and the different transmission points 1.4 and 1.5, while broadcasting means the routing of the stream from the transmission points to the final users. The whole constitutes what is referred to as a broadcasting system. The stream distributed by the distribution network 1.2 is distributed at the transmission points 1.4 and 1.5. Likewise, the stream distributed by the distribution network 1.3 is distributed at the transmission points 1.4 and 1.5. Each transmission point therefore receives two versions of the same data stream. In the example in the figure, these two versions have been distributed by two different distribution networks, for example a satellite distribution network and an IP (Internet Protocol) distribution network. It is also possible to distribute the different versions of the stream on two different routes within the same distribution network. It is also possible to use more than two distribution networks. In summary, a plurality of versions of the data stream are distributed by one or more distribution networks at one or more transmission points.

This redundancy in the distribution of the data stream is achieved so that the transmission point can effect a switching between the different versions of the stream received. This switching will be effected, for example, when there is a problem in the distribution of the stream version being broadcast. In this way technical incidents that may interfere with the distribution are guarded against.

The different distribution networks or the different routes within the same distribution network taken by the different versions of the stream give rise in particular to an often different latency in the distribution. Problems of jitter may possible appear in the stream delivered. Because of this, the different stream versions distributed may be received by the transmission point with slight offsets in time, which may range up to several hundreds of milliseconds but less than one second. Because of these offsets, it is often necessary for the transmission point to resynchronise itself on the stream in the SFN sense during switching. This phase of resynchronisation of the transmission point may cause ruptures in the broadcasting giving rise to interruptions in service that are a nuisance for the final user.

The invention aims to solve the above problems by proposing a device for the fine synchronisation of different versions of a stream of data received with a certain offset or different jitters. To do this, this device is provided with error analysis means within the meaning of the ETR 290 standard, SFN temporal synchronisation means and data selection means for determining the stream, the data of which are read instantaneously.

Use of this device makes it possible to finely synchronise the different versions of a received data stream at the input of a transmission point of an SFN network and to generate an output stream the data of which can be read alternately in the two streams received according to their reception conditions, Any switchings between these different versions of the stream are done without impact, since the switching does not risk causing a loss of SFN synchronisation of the transmission point.

The invention concerns a device for synchronising different versions of the same packet digital data stream intended to be broadcast in a broadcasting network on a single frequency comprising a plurality of channels, one channel per version of the stream received; each channel comprising means of detecting errors in the stream and synchronisation means intended to extract synchronisation information from this stream and to store the data of the stream in a data storage means.

The device also comprises means of generating, from the different versions of the received data stream, a single output stream corresponding to the data stream the different versions of which are received as an input by a single data reading means of at least one memory of one of the channels, this reading being synchronised by means of the synchronisation data extracted.

According to a particular embodiment of the invention, the means of detecting errors in the stream generate an error signal synchronised with the stream and indicating the presence or not of an error detected in this stream.

According to a particular embodiment of the invention, the device also has means enabling the user to mask certain errors detected by the error detection means.

According to a particular embodiment of the invention, the synchronisation means comprise means of detecting error criteria.

According to a particular embodiment of the invention, the error criteria detection means generate an error signal synchronised with the stream and indicating that an error criterion is detected or not.

According to a particular embodiment of the invention, the device also has means enabling the user to mask certain errors detected by the error criteria detection means.

According to a particular embodiment of the invention, the error criteria detection means generate an error signal combining the error signal generated by the error detection means and the error criteria indications.

According to a particular embodiment of the invention, the single reading means comprises means of switching the reading onto the memory of another channel when a non-masked error or error criterion is detected on the active channel, no error being detected on the other channel.

The invention also concerns a method of synchronising different versions of the same packet digital data stream intended to be broadcast in a broadcasting network on a single frequency, which comprises a step of processing the different versions of the stream received by a plurality of channels; the processing performed by each channel comprising a step of detecting errors in the stream, a synchronisation step intended to extract synchronisation information from the stream and to store the data of the stream in a data storage means.

The method also comprises a step of generating, from the different versions of the received data stream, a single output stream corresponding to the data stream the different versions of which are received as an input by a single data reading means of at least one memory of one of the channels, this reading being synchronised by means of the extracted synchronisation data.

The features of the invention mentioned above, as well as others, will emerge more clearly from a reading of the following description of an example embodiment, said description being given in relation to the accompanying drawings, among which:

Figure 1:
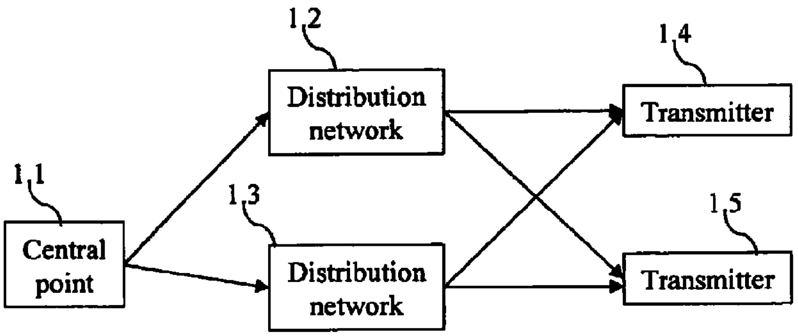
FIG. 1 illustrates the architecture of an example of a known broadcasting system.
Figure 2:
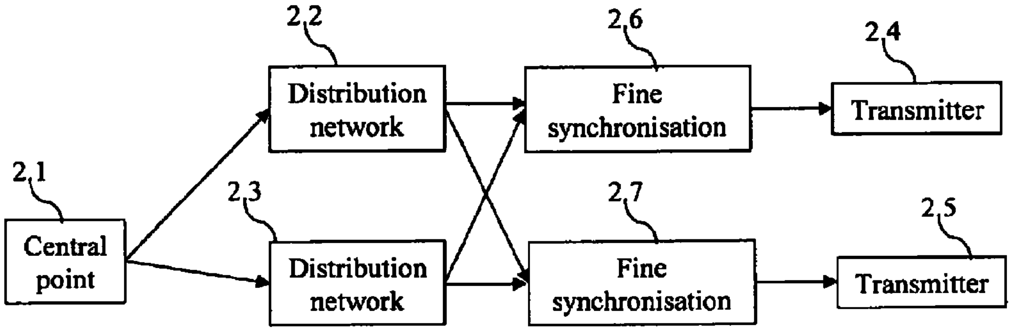
FIG. 2 illustrates the architecture of an example of a broadcasting system using the invention.

The invention is based on a fine resynchronisation of different stream versions upstream of the stream transmission points. An example of a broadcasting system architecture is illustrated in FIG. 2. It corresponds to the broadcasting system of FIG. 1 where fine synchronisation devices 2.6 and 2.7 are inserted upstream of the transmission points 2.4 and 2.5. These devices are responsible for receiving the different versions of the stream to be broadcast and synchronising them precisely. They produce an output stream corresponding to the input stream. These devices are also responsible for switching between the different input streams. This switching takes place without impact and does not interfere with the output of the stream at least as long as at least one of the versions of the stream received as an input is valid. The effect of protection against distribution problems is then obtained by virtue of the repetition of this distribution. Moreover, the switchings no longer risk causing SFN desynchronisation of the transmission point since the stream transmitted as an output is transmitted without impact and without interference.

Figure 3:
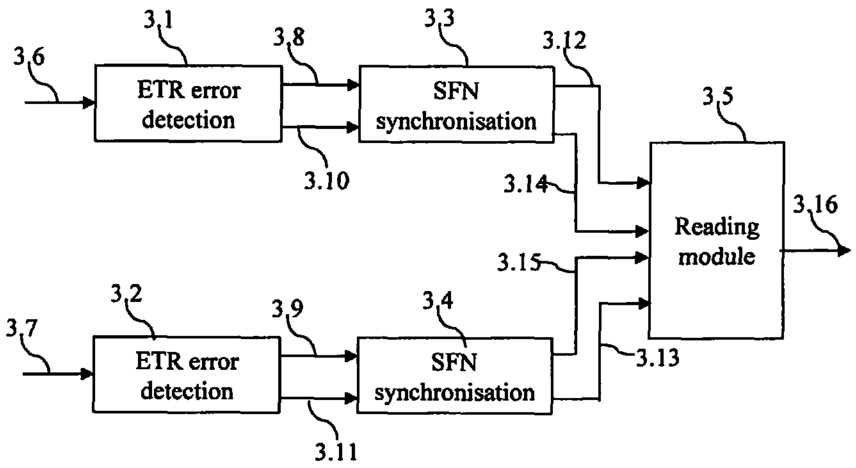
FIG. 3 illustrates the architecture of the device according to the invention.

FIG. 3 illustrates the general architecture of the device according to an example embodiment of the invention. In this example the device is designed around two channels. Each of these channels processes a version of the stream received. This device receives as an input two versions of the same TS stream 3.6 and 3.7. In this example, the streams are transmitted by means of an ASI (Asynchronous Serial Interface), a data stream format often used for transporting an MPEG transport stream. However, the physical transfer interface can also be an IP or satellite link transporting TS packets. These streams are first of all processed by two identical modules 3.1 and 3.2, one on each channel, which are ETR error detection modules. These modules are thus called since their function is to implement the detection of errors on the measurement and analysis of the stream in accordance with the technical report of the ETSI (European Telecommunications Standards Institute) referenced ETR 290 with the title "Digital Video Broadcasting (DVB): Measurement guidelines for DVB systems" and more particularly the paragraph "Measurement and analysis of the MPEG-2 transport stream" in this document. This paragraph defines precisely a collection of directives aimed at proposing criteria measurements on an MPEG-2 TS transport stream. These tests aim to establish conformity of the stream with the standard and make it possible to detect a certain number of errors on the stream. Among these errors that can be detected, TS synchronisation loss errors, PAT errors or continuity counter errors can be cited. It goes without saying that the list of errors actually measured may vary from one embodiment of the invention to another. These errors are classified according to three priority levels; all the three priority levels can be implemented. Advantageously, this list serves as a condition for switching from one stream to another. The user can define the errors causing switching onto another channel, the other errors then being said to be masked, that is to say some errors detected are not indicated by the error signal. The selection of the switching conditions is made by means of a man/machine interface. The ETR error detection modules 3.1 and 3.2 bring out the input stream that they receive in the form of two streams 3.8 and 3.9. Moreover, the list of errors will make it possible to define an ETR error signal 3.10 and 3.11 at the output of the ETR error detection module. This signal is synchronised on the start of the TS packets of the streams 3.8 and 3.9. For each TS packet of the stream, it indicates in a binary manner by a value at 0 or 1 whether the packet contains an error. The errors masked by the user do not appear at this error signal. For example, the error signal will be at 1 when an error defined by the user occurs and will be at 0 if the error is masked or there is no error. The reverse convention could be used. This signal is therefore synchronised with the stream and indicates the presence or not of an error detected in this stream.

The stream output from the ETR error detection module and the error signal generated are then input into an SFN synchronisation module 3.3 or 3.4. These modules perform an SFN synchronisation, that is to say they extract from the stream the SFN synchronisation information and store the data of the stream in a memory from the start of the first mega-frame detected. They analyse the stream received in search of MIP (Mega-frame Initialisation Packet) synchronisation packets. The mechanism for synchronisation by the insertion of MIP packets is described in the ETSI standard TS 101 191 the title of which is "Digital Video Broadcasting (DVB); DVB mega-frame for Single Frequency Network (SFN) synchronization".

Initially, the MIP package is analysed in order to extract therefrom synchronisation data the STS (Synchronisation Time Stamp) of which indicates the time difference between the last clock pip of the reference clock having a period of one second derived from the GPS (Global Positioning System) that precedes the start of the current mega-frame and its actual start. The MND parameter, the abbreviation for maximum network delay, is also analysed, defined in the ETSI standard TS 101 191 under the name maximum_delay as well as the modulation rate information contained in the TPS (Transmission Parameter Signalling) information. As soon as the first mega-frame has been detected, the stream is stored in a memory.

A certain number of error criteria are then determined with regard to the SFN synchronisation by the synchronisation modules. It is a case of specific errors of the SFN synchronisation defined in ETR 290. Among these there can be cited a verification of the CRC of the MIP packet, verification of the size of the mega-frame and the validity of the STS. Thus at least three types of so-called SFN errors are verified. An error signal of the same type as that calculated by the module for detecting the ETR errors is then generated. This error signal is therefore also synchronised with the stream and indicates that an error criterion is detected or not. Here also, the user can decide to mask some of these errors. Advantageously, this error signal is combined with the signal issuing from the ETR error detection module in order to form only a single error signal 3.14 and 3.13 indicating that an ETR or SFN error is present.

The error signal is present over the whole of the stream. Generally the errors are synchronised with the MIP packets; however, errors may be present on packets other than MIP packets, for example when the error concerns the size of the mega-frames. This is because, when the mega-frame is too short, the error is situated on the MIP packet but, when it is too long, it is situated on the packet that should have been the next MIP packet.

As soon as the start of a mega-frame has been detected, at least the current mega-frame, the packets are stored in a data storage means, typically a memory. This is done for the two versions of the stream 3.12 and 3.15.

The output stream 3.16 is generated by the reading module 3.5. This reading module is responsible for reading the data in the memories of the SFN synchronisation modules 3.3 and 3.4. This reading is constrained timewise by the parameters resulting from the analysis of the MIP packets by the SFN synchronisation modules. In fact, the synchronisation proper is therefore rather done by this reading module 3.5. This module uses the information from the error signals 3.13 and 3.14 in order to select the memory the data of which is used to generate the output stream 3.16.

Perfect resynchronisation of the two streams is due to the fact that a single reading process occurs for the two SFN synchronisation modules. If the two streams were synchronised independently via two independent SFN synchronisation modules, the two streams could still differ in time from a clock time. In the context of the invention, we have a single synchronised stream generated from the two streams received.

The process of reading the memories is therefore slaved timewise to the SFN data read in the MIP packets. The problem of determining the stream the data of which are used for the slaving is not posed. This is because, when the streams are sufficiently offset in time so that, at a time t, the same mega-frame is not processed, one of the streams is so delayed that it is considered to be desynchronised and is not used. The information of the other stream is therefore used. This other stream is then considered to be singleton and the SFN synchronisation is done in the same way as the reception of a single stream. Next, when the next mega-frame is processed, the same mega-frame will be processed for the two streams, and the SFN slaving time data then issue from two copies of the same MIP packet and are therefore identical.

The reading mechanism consists of two steps. During a first step referred to as the initialisation phase, the reading module waits until at least one of the two memories is available. It is considered that a memory is available when data are present in the memory, the memory does not overflow and the corresponding error signal indicates that there are no errors on this channel. Consequently the reading mechanism initiates the reading of the data at the start of a mega-frame. The time of reading the start of the mega-frame is calculated according to the data issuing from the MIP packet. It corresponds to the value of the STS field added to the MND field from which a parameter configurable by the user and called the residual transmission delay is deducted. This delay makes it possible to anticipate the transmission of the mega-frame. This is because the equipment is situated upstream of the transmitter in a broadcasting chain, and the transmitter must effect the modulation the calculation time of which is non-zero and must transmit the mega-frame at time STS+MND. Because of this information, it is necessary to anticipate the transmission time of the mega-frame at the equipment described. The reading takes place at the modulation rate of the signal generated. The reading continues in this way, mega-frame after mega-frame.

In a second steady-state step, at each new mega-frame sent, the reading module ensures that the output is properly synchronised by comparing the time of sending of the mega-frame with the theoretical sending time. This difference must be less than 1 μs.

At the initiation of the reading mechanism the active channel is defined as being the channel from which the data are read. In fact the data of the other channel, if available, are also read to avoid clogging of the memory in particular when memories of the FIFO (First In First Out) type are used. It is therefore the data of the active channel that are used for generating the output stream. The active channel is initially the first channel available. Next, as long as this channel is available and therefore as long as it contains data and the corresponding error signals an absence of error, it remains the active channel. When the second channel becomes available, reading of the memory will commence at the moment of the next mega-frame, in order to align the two memories being output.

Just before the sending of each TS packet, it is checked that the active channel is still available; it is checked whether it contains data and its error signal indicates an absence of error. Where the active channel is no longer available and the other channel is available, the other channel becomes the active channel and the reading module begins to use the data read on the second channel in order to generate the output signal. The channel that has become unavailable is reinitialised, which means that the memory is reset and the TS packets begin to be stored in the memory as from the next mega-frame. This switching of active channel is done without any delay and is therefore undetectable on the output stream. It does not therefore give rise to any SFN desynchronisation of the stream generated; it is said to be a seamless switch. This switching can be repeated from one channel to the other each time the active channel exhibits an error, which is detected by the corresponding error signal.

In the case where both channels are subject to errors, the generation stops and the reading module is interrupted. The two channels are reinitialised. It is then necessary to repeat the first initialisation step in order to re-establish generation of an output signal on the start of a synchronised mega-frame.

Likewise, when the inactive channel is no longer available, it is reinitialised.

Being able to mask certain errors, both at the ETR error detection module and the SFN synchronisation module of a channel, makes it possible to adapt the sensitivity of the equipment to the robustness of the streams encountered. When the streams received contain a large number of errors some of them will be able to be masked in order to limit the occurrence of losses of stream, that is to say the moments when the two channels are in error or the equipment interrupts the generation of an output stream.

Another advantage of the invention lies in the fact that a single reading means manages the reading in the memories of the channels, thus ensuring perfect synchronisation of the latter, to within a byte, which is difficult to achieve in a solution that would use two independent SFN synchronisations.

The embodiment of the invention described comprises two channels, but a person skilled in the art will understand that embodiments comprising more than two channels are possible. It suffices to duplicate the existing channels identically with regard to the ETR error detection module and the SFN synchronisation module. The reading module is for its part adapted to be able to read all the available channels and switch on to any one of these channels. It is thus possible to increase the stream broadcasting redundancy.

The embodiment of the invention described applies in the context of the DVB standard, but a person skilled in the art will understand that embodiments using other standards are also possible. The ETR detection module will use the validity criteria of the chosen standard and the synchronisation module will be based on the synchronisation packets of the standard implemented. For example, in the case of the DTMB standard, the same analysis criteria will be used as ETR 290 for the validity of the input stream and will use the SIP packets for SFN synchronisation.

The invention claimed is:

1. Device for synchronising different versions of the same packet digital data stream intended to be broadcast in a broadcasting network on a single frequency, characterised in that it comprises:

- a plurality of channels, one channel per version of the stream received;
- each channel comprising:
- means of detecting errors in the stream which is composed of mega-frames;
- synchronisation means intended to extract synchronisation information from the stream and to store the data of the stream in a data storage means, the synchronisation information indicating a time difference between the last clock of a reference clock that precedes the start of a current mega-frame;
- the device also comprising means of generating, from the different versions of the received data stream, a single output stream corresponding to the data stream the different versions of which are received as an input by a single data reading means of at least one memory of one of the channels, the time of reading being synchronised by means of the synchronisation data extracted from which a configurable parameter is subtracted, the single output stream being intended to be broadcasted on the network in the single frequency by a transmitter in a synchronised manner with other transmitters broadcasting the same data stream.

2. Synchronisation device according to claim 1, characterised in that the means of detecting errors in the stream generate an error signal synchronised with the stream and indicating the presence or not of an error detected in this stream.

3. Synchronisation device according to claim 2, characterised in that the error criteria detection means generate an error signal combining the error signal generated by the error detection means and the error criteria indications.

4. Synchronisation device according to claim 1, characterised in that the synchronisation means comprise means of detecting error criteria.

5. Synchronisation device according to claim 4, characterised in that the error criteria detection means generate an error signal synchronised with the stream and indicating that an error criterion is detected or not.

6. Synchronisation device according to claim 4, characterised in that it also has means enabling the user to mask certain errors detected by the error criteria detection means.

7. Synchronisation device according to claim 1, characterised in that it also has means enabling the user to mask certain errors detected by the error detection means.

8. Synchronisation device according to claim 1, characterised in that the single reading means comprises means of switching the reading onto the memory of another channel when a non-masked error or error criterion is detected on the active channel, no error being detected on the other channel.

9. Method for synchronising different versions of the same packet digital data stream intended to be broadcast in a broadcasting network on a single frequency, characterised in that it comprises:

- a step of processing the different stream versions received by a plurality of channels;
- the processing effected by each channel comprising:
- a step of detecting errors in the stream which is composed of mega-frames;
- a synchronisation step intended to extract synchronisation information from the stream and to store the data of the stream in a data storage means, the synchronisation information indicating a time difference between the last clock of a reference clock that precedes the start of a current mega-frame;
- the method also comprising a step of generating, from the different versions of the received data stream, a single output stream corresponding to the data stream the different versions of which are received as an input by a single means of reading the data of at least one memory of one of the channels, the time of reading being synchronised by means of the synchronisation data extracted from which a configurable parameter is subtracted, the single output stream being intended to be broadcasted on the network in the single frequency by a transmitter in a synchronised manner with other transmitters broadcasting the same data stream.

* * * * *